(12) United States Patent
Wu

(10) Patent No.: US 9,748,513 B2
(45) Date of Patent: Aug. 29, 2017

(54) LIGHT EMITTING DEVICE AND MANUFACTURING METHOD THEREOF, AND DISPLAY DEVICE

(71) Applicant: BOE TECHNOLOGY GROUP CO., LTD., Beijing (CN)

(72) Inventor: Changyan Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/415,683

(22) PCT Filed: May 7, 2014

(86) PCT No.: PCT/CN2014/076953
§ 371 (c)(1),
(2) Date: Jan. 19, 2015

(87) PCT Pub. No.: WO2015/096349
PCT Pub. Date: Jul. 2, 2015

(65) Prior Publication Data
US 2015/0380677 A1 Dec. 31, 2015

(30) Foreign Application Priority Data

Dec. 27, 2013 (CN) .......................... 2013 1 0741732

(51) Int. Cl.
*H01L 51/52* (2006.01)
*H01L 51/56* (2006.01)
(52) U.S. Cl.
CPC ...... *H01L 51/5234* (2013.01); *H01L 51/5209* (2013.01); *H01L 51/5218* (2013.01);
(Continued)
(58) Field of Classification Search
CPC . H01L 51/5234; H01L 51/5218; H01L 51/56; H01L 2251/308
See application file for complete search history.

(56) References Cited

U.S. PATENT DOCUMENTS

2007/0114523 A1 5/2007 Oumi et al.
2007/0257608 A1 11/2007 Tyan et al.
(Continued)

FOREIGN PATENT DOCUMENTS

| CN | 1438828 A | 8/2003 |
|---|---|---|
| CN | 1498046 A | 5/2004 |

(Continued)

OTHER PUBLICATIONS

Form PCT/ISA/237 issued in International application No. PCT/CN2014/076953 mailed Sep. 28, 2014.
(Continued)

*Primary Examiner* — Fernando L Toledo
*Assistant Examiner* — Neil Prasad
(74) *Attorney, Agent, or Firm* — Nath, Goldberg & Meyer; Joshua B. Goldberg; Leonid D. Thenor

(57) ABSTRACT

The invention provides a light emitting device and a manufacturing method thereof, and a display device. The light emitting device comprises a base substrate and a laminated structure formed on the base substrate, the laminated structure including a first electrode, an organic layer and a second electrode which are laminated, the organic layer is provided between the first electrode and the second electrode, wherein the second electrode is provided with light extraction particles therein. In solutions of the light emitting device and the manufacturing method thereof, and the display device, the metal electrode is provided with light extraction particles therein, the light extraction particles destroy the surface plasma waves generated by the metal electrode, so that light fallen into the surface plasma waves can be extracted, the light extraction efficiency of the metal electrode is increased, and thus the light extraction efficiency of the light emitting device is increased.

17 Claims, 2 Drawing Sheets

(52) U.S. Cl.
CPC ...... *H01L 51/5225* (2013.01); *H01L 51/5262* (2013.01); *H01L 51/56* (2013.01); *H01L 2251/308* (2013.01); *H01L 2251/5369* (2013.01)

(56) References Cited

U.S. PATENT DOCUMENTS

| | | |
|---|---|---|
| 2008/0051607 A1 | 2/2008 | Ichimura et al. |
| 2011/0062481 A1* | 3/2011 | Oyamada ............... B82Y 20/00 257/98 |
| 2012/0081777 A1* | 4/2012 | Heikenfeld .......... G02B 26/005 359/290 |
| 2013/0105770 A1* | 5/2013 | Pschenitzka ........ H01L 31/0232 257/40 |
| 2013/0114269 A1* | 5/2013 | Domercq ............ H01L 51/5215 362/311.05 |
| 2014/0159090 A1* | 6/2014 | Huang ................... H01L 33/02 257/98 |

FOREIGN PATENT DOCUMENTS

| | | |
|---|---|---|
| CN | 101212024 A | 7/2008 |
| CN | 102620235 A | 8/2012 |
| CN | 103460798 A | 12/2013 |
| CN | 103715368 A | 4/2014 |
| JP | 2010186613 A | 8/2010 |
| KR | 20130051296 A | 5/2013 |
| KR | 20130111485 A | 10/2013 |
| WO | 2013/001891 A1 | 1/2013 |

OTHER PUBLICATIONS

1st Office Action issued in Chinese application No. 201310741732.1 dated Jul. 24, 2015.
International Search Report for International Application No. PCT/CN2014/076953.
2nd office action issued in Chinese application No. 201310741732.1 dated Dec. 3, 2015.
3rd office action issued in Chinese application No. 201310741732.1 dated Jun. 1, 2016.

* cited by examiner

LIGHT EMITTING DEVICE AND MANUFACTURING METHOD THEREOF, AND DISPLAY DEVICE

This is a National Phase Application filed under 35 U.S.C. 371 as a national stage of PCT/CN2014/076953, filed May 7, 2014, an application claiming the benefit of Chinese Application No. 201310741732.1, filed Dec. 27, 2013, the content of each of which is hereby incorporated by reference in its entirety.

FIELD OF THE INVENTION

The invention relates to the field of display technology, and particular to a light emitting device and a manufacturing method thereof, and a display device.

BACKGROUND OF THE INVENTION

Organic Light-Emitting Diode (OLED) has self-luminous characteristic, and when a current is passing through the OLED, organic material in the OLED may emit light. In comparison with a conventional liquid crystal display, OLED display device has a screen with larger viewing angle and can save electrical energy, therefore, OLED display device has incomparable advantages.

An OLED display device may comprise: a base substrate; and a transparent electrode, an organic layer and a metal electrode formed on the inner surface of the base substrate, wherein the organic layer is provided on the transparent electrode, and the metal electrode is provided on the organic layer. In order to increase the light extraction efficiency of the OLED display device, a light extraction structure may be additionally provided in the OLED display device. In the prior art, the light extraction structure may be provided on the outer surface of the base substrate or provided between the base substrate and the organic layer, so that the light extraction efficiency of the OLED display device may be increased through the light extraction structure. In a case of the light extraction structure being provided on the outer surface of the base substrate, the light extraction structure may be scattered particles, Micro Lens Array (MLA) or a rough surface structure, wherein the rough surface structure may be a structure directly formed on the outer surface of the base substrate, the rough surface structure being provided on the outer surface of the base substrate may reduce substrate mode, so that the light extraction efficiency may be increased. In a case of the light extraction structure being provided on the inner surface of the base substrate, the light extraction structure may be scattered particles, a grating structure or a rough surface structure, wherein the rough surface structure may be a structure directly formed on the inner surface of the base substrate, the rough surface structure being provided on the inner surface of the base substrate may reduce substrate mode and organic mode, so that the light extraction efficiency may be increased.

However, above solutions in the prior art just can increase the light extraction efficiency of OLED to some extent, and in practical application, the light extraction efficiency is still low.

SUMMARY OF THE INVENTION

The invention provides a light emitting device and a manufacturing method thereof, and a display device, which can increase the light extraction efficiency of the light emitting device.

To achieve the above object, the invention provides a light emitting device comprising: a base substrate and a laminated structure formed on the base substrate, the laminated structure including a first electrode, an organic layer and a second electrode which are laminated, the organic layer is provided between the first electrode and the second electrode, wherein the second electrode is provided with light extraction particles therein.

Optionally, the first electrode is provided on the base substrate, and the laminated structure further comprises a transparent electrode provided between the organic layer and the second electrode.

Optionally, the second electrode is provided on the base substrate, and the laminated structure further comprises a transparent electrode provided between the base substrate and the second electrode.

Optionally, the second electrode is a metal electrode, and the first electrode is a transparent electrode.

Optionally, the metal electrode has a reflectivity of more than 95%.

Optionally, the metal electrode has a thickness of 50 nm to 300 nm.

Optionally, the transparent electrode has a thickness of 10 nm to 100 nm.

Optionally, light extraction particles are made of one or more of metal oxide, polymer, silicon oxide, zinc sulfide and zinc selenide.

Optionally, the size of the light extraction particle is 10 nm to 1000 nm.

Optionally, the transparent electrode is made of one or more of ITO, IZO, ITZO, AZO, FTO and GITO.

Optionally, when the transparent electrode is made of more of ITO, IZO, ITZO, AZO, FTO and GITO, the transparent electrode is of a multilayered structure.

To achieve the above object, the invention provides a display device comprising the above light emitting device.

To achieve the above object, the invention provides a manufacturing method of a light emitting device, comprising steps of: laminatedly forming a first electrode, an organic layer and a second electrode on a base substrate so that the organic layer is formed between the first electrode and the second electrode, and the second electrode is provided with light extraction particles therein.

Optionally, the step of laminatedly forming a first electrode, an organic layer and a second electrode on a base substrate comprises:

forming the first electrode on the base substrate;
forming the organic layer on the first electrode;
forming the second electrode on the organic layer, and
wherein the manufacturing method further comprises, after forming the organic layer and before forming the second electrode, a step of:
forming a transparent electrode on the organic layer.

Optionally, the step of laminatedly forming a first electrode, an organic layer and a second electrode on a base substrate comprising: forming the second electrode on the base substrate;
forming the organic layer on the second electrode;
forming the first electrode on the organic layer, and
wherein the manufacturing method further comprises, before forming the second electrode, a step of:
forming a transparent electrode on the base substrate.

Optionally, the second electrode is a metal electrode, and the first electrode is a transparent electrode.

The invention has following advantages:

In solutions of the light emitting device and the manufacturing method thereof, and the display device, the metal electrode is provided with light extraction particles therein, the light extraction particles destroy the surface plasma waves generated by the metal electrode, so that light fallen into the surface plasma waves can be extracted, the light extraction efficiency of the metal electrode is increased, and thus the light extraction efficiency of the light emitting device is increased.

DETAILED DESCRIPTION OF EMBODIMENTS

To make persons skilled in the art better understand the solutions of the invention, the light emitting device and the manufacturing method thereof, and the display device will be described in detail below in conjunction with drawings.

Figure 1:
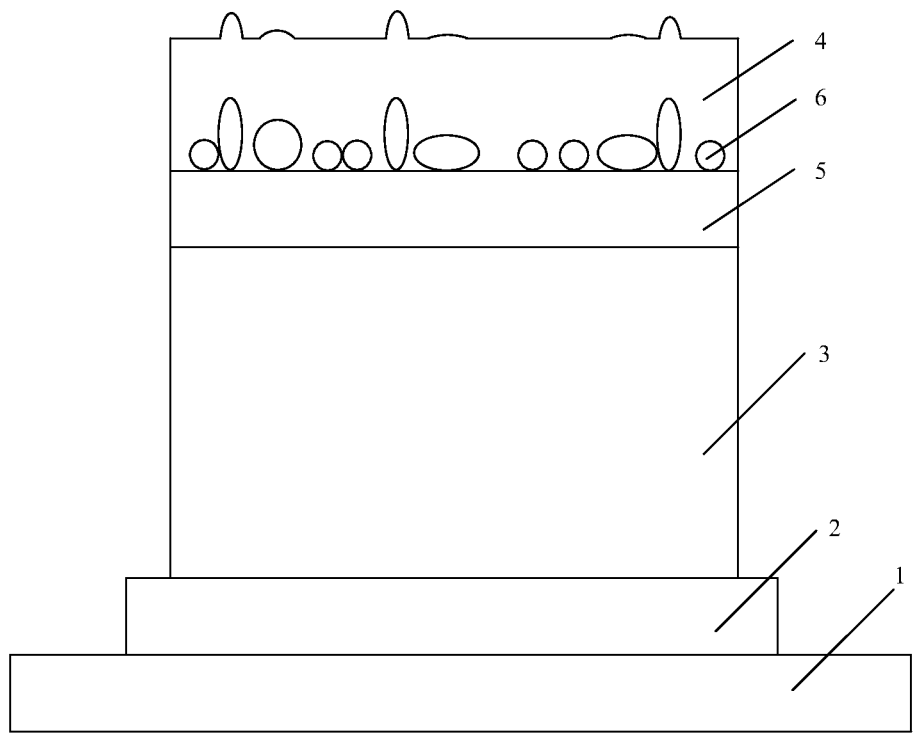
FIG. 1 is a structural diagram of a light emitting device according to the first embodiment of the invention.

FIG. 1 is a structural diagram of a light emitting device according to the first embodiment of the invention, as shown in FIG. 1, the light emitting device comprises: a base substrate 1; and a first electrode 2, an organic layer 3 and a metal electrode 4 which are laminatedly formed on the base substrate 1 in sequence, the organic layer 3 is provided between the first electrode 2 and the metal electrode 4, and the metal electrode 4 is provided with light extraction particles 6 therein.

In the embodiment, the first electrode 2 is on the base substrate 1, the organic layer 3 is on the first electrode 2, and the metal electrode 4 is on the organic layer 3, as shown in FIG. 1. In the embodiment, the first electrode 2, the organic layer 3 and the metal electrode 4 may be regarded as a laminated structure formed on the base substrate, and one side of the laminated structure that the metal electrode 4 is located on is formed on the base substrate 1.

The first electrode 2 is a transparent electrode, material of the first electrode 2 may include: transparent conductive oxide TCO, for example, TCO may include one or more of ITO, IZO, ITZO, AZO, FTO and GITO. In a case that the material of the first electrode 2 includes more than one of ITO, IZO, ITZO, AZO, FTO and GITO, the first electrode 2 is a multilayered structure. The multilayered structure may include a plurality of mixture layers which are accumulatively provided, each of the mixture layers may be formed by mixing more than one of above ITO, IZO, ITZO, AZO, FTO and GITO, and densities of the plurality of mixture layers may be the same or different. Alternatively, the multilayered structure may include a plurality of single-material layers which are accumulatively provided, each of the single-material layers may be formed by one of above ITO, IZO, ITZO, AZO, FTO and GITO, and materials of the plurality of single-material layers may be the same or different.

The thickness of the metal electrode 4 may be 50 nm to 300 nm. The metal electrode 4 may be formed of one of Al, Ag, Ca, Mg, Li and Yb or mixture thereof, alternatively, the metal electrode 4 may be a multilayered structure formed of more than one of Al, Ag, Ca, Mg, Li and Yb.

In the embodiment, preferably, the metal electrode 4 has a reflectivity of more than 95%, in other words, the metal electrode 4 is preferably formed of metal material with a reflectivity of more than 95%. In order to ensure that the metal electrode 4 has a reflectivity of more than 95%, preferably, the metal electrode 4 is formed of Ag.

The light extraction particles 6 are made of one or more of metal oxide, polymer, silicon oxide, zinc sulfide and zinc selenide.

As shown in FIG. 1, by providing light extraction particles 6 in the metal electrode 4, a rough surface is formed on the metal electrode 4 due to the light extraction particles 6, the rough surface may effectively destroy the surface plasma waves generated by the metal electrode, so that light fallen into the surface plasma waves may be extracted, thus the light extraction efficiency of OLED display device is increased.

Preferably, the sizes of the light extraction particles 6 may be 10 nm to 1000 nm. The sizes of the light extraction particles 6 within the above range may cause large surface roughness of the metal electrode 4, so that the surface plasma waves generated by the metal electrode 4 can be destroyed better, and thus the light extraction efficiency of the light emitting device can be increased.

Shapes of the light extraction particles 6 may be arbitrary shapes, for example, the shapes of the light extraction particles 6 may be of spherical, ellipsoidal, cubical, cuboidal, prismatic, pyramidal, cylindrical or any other regular or irregular shapes. Arbitrary shapes of the light extraction particles 6 may cause large surface roughness of the metal electrode 4, so that the surface plasma waves generated by the metal electrode 4 can be destroyed better, and thus the light extraction efficiency of the light emitting device can be increased.

Compared to the prior art, by providing the light extraction particles 6 in the metal electrode 4, the light extraction efficiency of the light emitting device may be increased by 150% in principle. Optionally, a transparent electrode 5 is further provided between the organic layer 3 and the metal electrode 4. Specifically, the transparent electrode 5 is on the organic layer 3, and the metal electrode 4 is on the transparent electrode 5.

The transparent electrode 5 may have a thickness of 10 nm to 100 nm. It is not necessary for the transparent electrode to have a large thickness.

The material of the transparent electrode 5 may include TCO, for example, the TCO may include one or more of ITO, IZO, ITZO, AZO, FTO and GITO. In a case of the material of the transparent electrode 5 including more than one of ITO, IZO, ITZO, AZO, FTO and GITO, the transparent electrode 5 is a multilayered structure. The multilayered structure may include a plurality of mixture layers which are accumulatively provided, each of the mixture layers may be formed by mixing more than one of above ITO, IZO, ITZO, AZO, FTO and GITO, and densities of the plurality of mixture layers may be the same or different. Alternatively, the multilayered structure may include a plurality of single-material layers which are accumulatively provided, each of the single-material layers may be formed by one of above ITO, IZO, ITZO, AZO, FTO and GITO, and materials of the plurality of single-material layers may be the same or different.

In the embodiment, the first electrode 2 is an anode, the metal electrode 4 is a cathode; alternatively, the first electrode 2 is a cathode, the metal electrode 4 is an anode.

In the light emitting device in the embodiment, by providing light extraction particles in the metal electrode, the light extraction particles may destroy the surface plasma waves generated by the metal electrode, so that light fallen into the surface plasma waves may be extracted, thus the light extraction efficiency of the metal electrode can be increased, and the light extraction efficiency of the light emitting device can be increased. In the light emitting device in the embodiment, the transparent electrode is provided between the metal electrode and the organic layer to ensure injection and transfer characteristics of carriers between the metal electrode and the organic layer. In the embodiment, the metal electrode and the organic layer constitute a composite electrode, on the premise of injection and transfer characteristics of carriers between the metal electrode and the organic layer being ensured, the composite electrode may increase the light extraction efficiency of the light emitting device.

Figure 2:
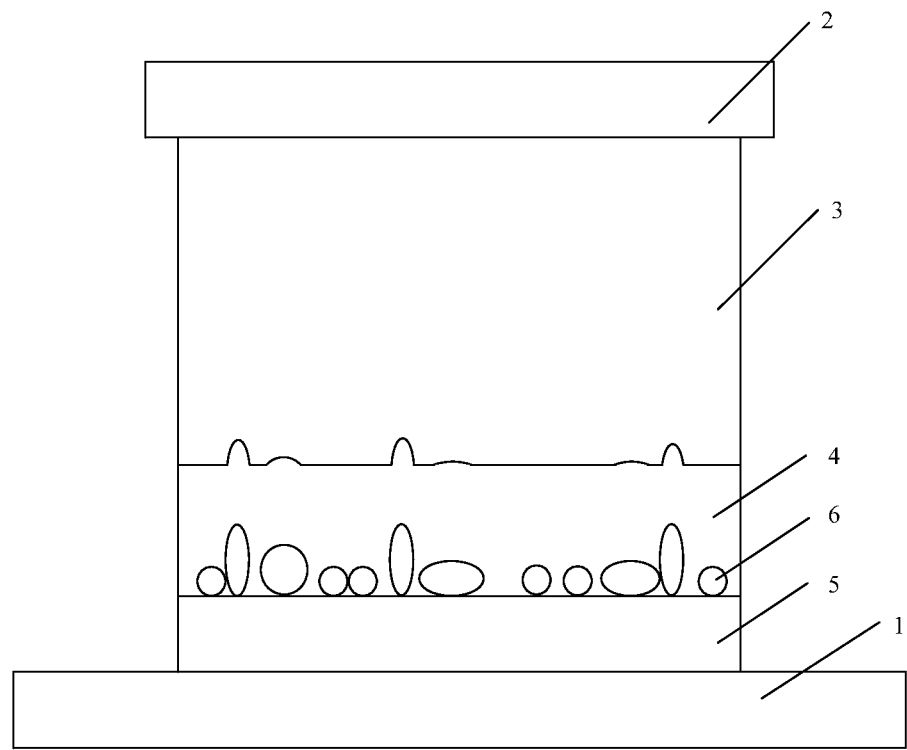
FIG. 2 is a structural diagram of a light emitting device according to the second embodiment of the invention.

FIG. 2 is a structural diagram of a light emitting device according to the second embodiment of the invention, as shown in FIG. 2, the light emitting device comprises: a base substrate 1; and a metal electrode 4, an organic layer 3 and a first electrode 2 which are laminatedly formed on the base substrate 1 in sequence, the organic layer 3 is provided between the first electrode 2 and the metal electrode 4, and the metal electrode 4 is provided with light extraction particles 6 therein.

In the embodiment, the metal electrode 4 is on the base substrate 1, the organic layer 3 is on the metal electrode 4, and the first electrode 2 is on the organic layer 3, as shown in FIG. 2. In the embodiment, the first electrode 2, the organic layer 3 and the metal electrode 4 may be regarded as a laminated structure formed on the base substrate, and one side of the laminated structure that the first electrode 2 is located on is formed on the base substrate 1.

The first electrode 2 is a transparent electrode, material of the first electrode 2 may include: transparent conductive oxide TCO, for example, TCO may include one or more of ITO, IZO, ITZO, AZO, FTO and GITO. In a case that the material of the first electrode 2 includes more than one of ITO, IZO, ITZO, AZO, FTO and GITO, the first electrode 2 is a multilayered structure. The multilayered structure may include a plurality of mixture layers which are accumulatively provided, each of the mixture layers may be formed by mixing more than one of above ITO, IZO, ITZO, AZO, FTO and GITO, and densities of the plurality of mixture layers may be the same or different. Alternatively, the multilayered structure may include a plurality of single-material layers which are accumulatively provided, each of the single-material layers may be formed by one of above ITO, IZO, ITZO, AZO, FTO and GITO, and materials of the plurality of single-material layers may be the same or different.

The thickness of the metal electrode 4 may be 50 nm to 300 nm. The metal electrode 4 may be formed of one of Al, Ag, Ca, Mg, Li and Yb or mixture thereof, alternatively, the metal electrode 4 may be a multilayered structure formed of more than one of Al, Ag, Ca, Mg, Li and Yb.

In the embodiment, preferably, the metal electrode 4 has a reflectivity of more than 95%, in other words, the metal electrode 4 is preferably formed of metal material with a reflectivity of more than 95%. In order to ensure that the metal electrode 4 has a reflectivity of more than 95%, preferably, the metal electrode 4 is formed of Ag.

The light extraction particles 6 are made of one or more of metal oxide, polymer, silicon oxide, zinc sulfide and zinc selenide.

As shown in FIG. 2, by providing light extraction particles 6 in the metal electrode 4, a rough surface is formed on the metal electrode 4 due to the light extraction particles 6, the rough surface may effectively destroy the surface plasma waves generated by the metal electrode, so that light fallen into the surface plasma waves may be extracted, thus the light extraction efficiency of OLED display device is increased.

Preferably, the sizes of the light extraction particles 6 may be 10 nm to 1000 nm. The sizes of the light extraction particles 6 within the above range may cause large surface roughness of the metal electrode 4, so that the surface plasma waves generated by the metal electrode 4 can be destroyed better, and thus the light extraction efficiency of the light emitting device can be increased.

Shapes of the light extraction particles 6 may be arbitrary shapes, for example, the shapes of the light extraction particles 6 may be of spherical, ellipsoidal, cubical, cuboidal, prismatic, pyramidal, cylindrical or any other regular or irregular shapes. Arbitrary shapes of the light extraction particles 6 may cause large surface roughness of the metal electrode 4, so that the surface plasma waves generated by the metal electrode 4 can be destroyed better, and thus the light extraction efficiency of the light emitting device can be increased.

Compared to the prior art, by providing the light extraction particles 6 in the metal electrode 4, the light extraction efficiency of the light emitting device may be increased by 150% in principle.

Optionally, the light emitting device in the embodiment further comprises a transparent electrode 5 between the base substrate 1 and the metal electrode 4. Specifically, the transparent electrode 5 is on the base substrate 1, the metal electrode 4 is on the transparent electrode 5 and the organic layer 3 is on the metal electrode 4.

The transparent electrode 5 may have a thickness of 10 nm to 100 nm. It is not necessary for the transparent electrode to have a large thickness.

The material of the transparent electrode 5 may include one or more of ITO, IZO, ITZO, AZO, FTO and GITO. In a case of the material of the transparent electrode 5 including more than one of ITO, IZO, ITZO, AZO, FTO and GITO, the transparent electrode 5 is a multilayered structure. The multilayered structure may include a plurality of mixture layers which are accumulatively provided, each of the mixture layers may be formed by mixing more than one of above ITO, IZO, ITZO, AZO, FTO and GITO, and densities of the plurality of mixture layers may be the same or different. Alternatively, the multilayered structure may include a plurality of single-material layers which are accumulatively provided, each of the single-material layers may be formed by one of above ITO, IZO, ITZO, AZO, FTO and GITO, and materials of the plurality of single-material layers may be the same or different.

In the embodiment, the first electrode 2 is an anode, the metal electrode 4 is a cathode; alternatively, the first electrode 2 is a cathode, the metal electrode 4 is an anode.

In the light emitting device in the embodiment, by providing light extraction particles in the metal electrode, the light extraction particles may destroy the surface plasma waves generated by the metal electrode, so that light fallen into the surface plasma waves may be extracted, thus the light extraction efficiency of the metal electrode can be increased, and the light extraction efficiency of the light emitting device can be increased. In the light emitting device in the embodiment, the transparent electrode is provided between the metal electrode and the organic layer to ensure injection and transfer characteristics of carriers between the metal electrode and the organic layer. In the embodiment, the metal electrode and the organic layer constitute a composite electrode, on the premise of injection and transfer characteristics of carriers of the light emitting device of its own being ensured, the composite electrode may increase the light extraction efficiency of the light emitting device.

A third embodiment according to the invention provides a display device, which comprises a light emitting device, the light emitting device may use the light emitting device in the first embodiment or the second embodiment, which will not be described repeatedly here. The light emitting device may comprise OLED.

A fourth embodiment of the invention provides a manufacturing method of a light emitting device, comprising steps of: laminatedly forming a first electrode, an organic layer and a second electrode on a base substrate so that the organic layer is formed between the first electrode and the second electrode, and the second electrode is provided with light extraction particles therein.

Optionally, the step of laminatedly forming a first electrode, an organic layer and a second electrode on a base substrate comprising:
  forming the first electrode on the base substrate;
  forming the organic layer on the first electrode;
  forming the second electrode on the organic layer, and
  wherein the manufacturing method further comprises, after forming the organic layer and before forming the second electrode, a step of:
  forming a transparent electrode on the organic layer.

Optionally, the step of laminatedly forming a first electrode, an organic layer and a second electrode on a base substrate comprising:
  forming the second electrode on the base substrate;
  forming the organic layer on the second electrode;
  forming the first electrode on the organic layer, and
  wherein the manufacturing method further comprises, before forming the second electrode, a step of:
  forming a transparent electrode on the base substrate.

Optionally, the second electrode is a metal electrode, and the first electrode is a transparent electrode.

In the light emitting device manufactured by the manufacturing method of a light emitting device in the embodiment, by providing light extraction particles in the metal electrode, the light extraction particles may destroy the surface plasma waves generated by the metal electrode, so that light fallen into the surface plasma waves may be extracted, thus the light extraction efficiency of the metal electrode can be increased, and the light extraction efficiency of the light emitting device can be increased. In the light emitting device in the embodiment, the transparent electrode is provided between the metal electrode and the organic layer, or between the base substrate and the metal electrode, to ensure injection and transfer characteristics of carriers between the metal electrode and the organic layer. In the embodiment, preferably, the metal electrode and the organic layer constitute a composite electrode, on the premise of injection and transfer characteristics of carriers of the light emitting device of its own being ensured, the composite electrode may increase the light extraction efficiency of the light emitting device.

Figure 3:
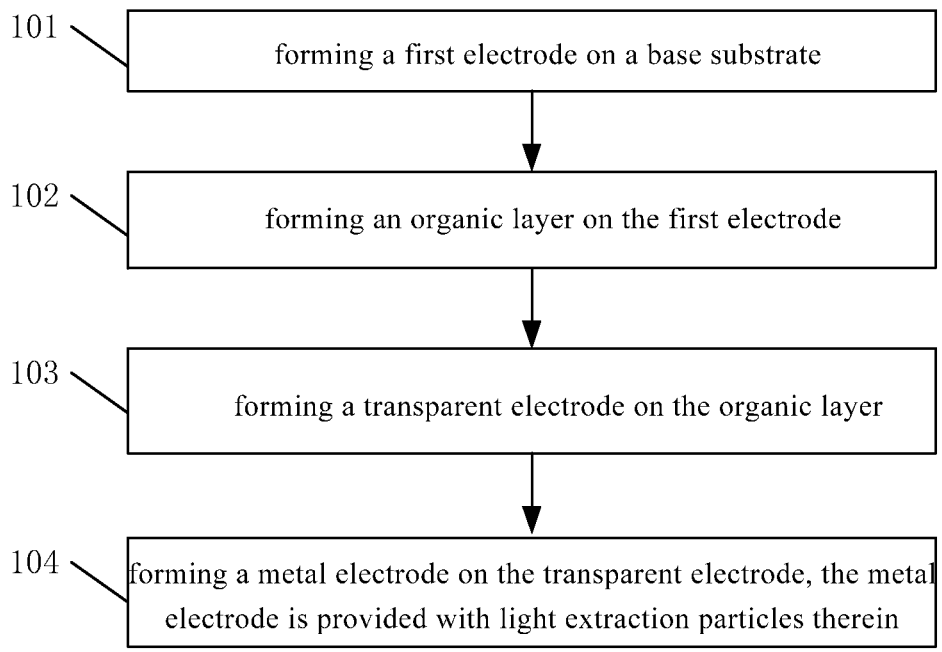
FIG. 3 is a flowchart of a manufacturing method of a light emitting device according to the fifth embodiment of the invention.

FIG. 3 is a flowchart of a manufacturing method of a light emitting device according to the fifth embodiment of the invention, as shown in FIG. 3, the method comprises:

step 101, forming a first electrode on a base substrate.

In the embodiment, a first electrode material layer may be formed on the base substrate, and then a patterning process is performed thereon to form the first electrode.

Specifically, forming a first electrode material layer on a base substrate may include: forming the first electrode material layer on the base substrate through a Physical Vapor Deposition (PVD) process or a wet process. The PVD process may include a sputter process, and the wet process may include a spin coating process, a slit coating process or an ink jet printing process.

Specifically, the patterning process may include processes, such as photoresist coating, exposure, development, etching, and photoresist peeling off.

step 102, forming an organic layer on the first electrode.

Specifically, the step of forming the organic layer may include: forming the organic layer through an evaporation process.

Alternatively, specifically, forming the organic layer may include: an organic material layer is formed through a wet process, and then a patterning process is performed thereon to form the organic layer. The wet process may include a spin coating process, a slit coating process or an ink jet printing process. The patterning process may include processes, such as photoresist coating, exposure, development, etching, and photoresist peeling off.

step 103, forming a transparent electrode on the organic layer.

Specifically, forming a transparent electrode on the organic layer may include: forming the transparent electrode through a PVD process. The PVD process may include a sputter process.

step 104, forming a metal electrode on the transparent electrode, wherein the metal electrode is provided with light extraction particles therein.

Specifically, forming the metal electrode may include: forming the light extraction particles on the transparent electrode, and forming the metal electrode above the light extraction particles through an evaporation process, so that the light extraction particles may be imbedded in the formed metal electrode. The metal electrode is formed with an uneven rough surface due to the light extraction particles.

Forming the light extraction particles on the transparent electrode may include: forming the light extraction particles with non-uniform morphologies and different sizes on the transparent electrode through a wet process, a Chemical Vapor Deposition (CVD) process or an evaporation process.

The manufacturing method of a light emitting device in the embodiment may be used to manufacture the light emitting device provided by the above first embodiment.

In the light emitting device manufactured by the manufacturing method of a light emitting device in the embodiment, by providing light extraction particles in the metal electrode, the light extraction particles may destroy the surface plasma waves generated by the metal electrode, so that light fallen into the surface plasma waves may be extracted, thus the light extraction efficiency of the metal electrode can be increased, and the light extraction efficiency of the light emitting device can be increased. In the light emitting device in the embodiment, the transparent electrode is provided between the metal electrode and the organic layer to ensure injection and transfer characteristics of carriers between the metal electrode and the organic layer. In the embodiment, the metal electrode and the organic layer constitute a composite electrode, on the premise of injection and transfer characteristics of carriers of the light emitting device of its own being ensured, the composite electrode may increase the light extraction efficiency of the light emitting device.

Figure 4:
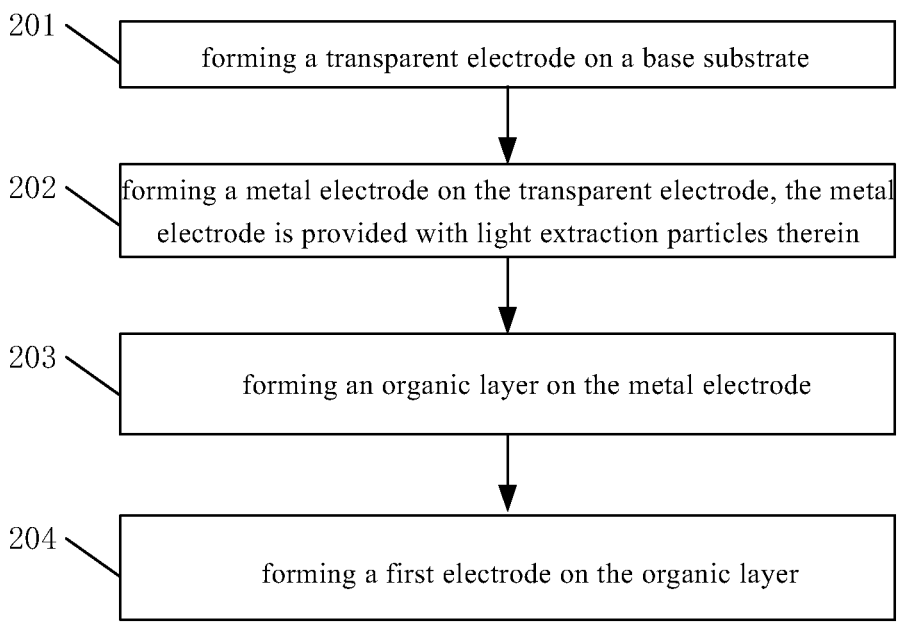
FIG. 4 is a flowchart of a manufacturing method of a light emitting device according to the sixth embodiment of the invention.

FIG. 4 is a flowchart of a manufacturing method of a light emitting device according to the sixth embodiment of the invention, as shown in FIG. 4, the method comprises:

step 201, forming a transparent electrode on a base substrate.

Specifically, forming a transparent electrode on a base substrate may include: forming the transparent electrode on the base substrate through a PVD process. The PVD process may include a sputter process.

step 202, forming a metal electrode on the transparent electrode, wherein the metal electrode is provided with light extraction particles therein.

Specifically, forming the metal electrode may include: forming the light extraction particles on the transparent electrode, and forming the metal electrode above the light extraction particles through an evaporation process, so that the light extraction particles may be imbedded in the formed metal electrode. The metal electrode is formed with an uneven rough surface due to the light extraction particles.

Forming the light extraction particles on the transparent electrode may include: forming the light extraction particles with non-uniform morphologies and different sizes on the transparent electrode through a wet process, a Chemical Vapor Deposition (CVD) process or an evaporation process.

step 203, forming an organic layer on the metal electrode.

Specifically, forming the organic layer may include: forming the organic layer through an evaporation process.

Alternatively, specifically, forming the organic layer may include: an organic material layer is formed on the metal electrode through a wet process, and then a patterning process is performed thereon to form the organic layer. The wet process may include a spin coating process, a slit coating process or an ink jet printing process. The patterning process may include processes, such as photoresist coating, exposure, development, etching, and photoresist peeling off.

step 204, forming a first electrode on the organic layer.

In the embodiment, a first electrode material layer may be formed on the organic layer, and then a patterning process is performed thereon to form the first electrode.

Specifically, forming the first electrode material layer may include: forming the first electrode material layer on the organic layer through a Physical Vapor Deposition (PVD) process or a wet process. The PVD process may include a sputter process, and the wet process may include a spin coating process, a slit coating process or an ink jet printing process.

Specifically, the patterning process may include processes, such as photoresist coating, exposure, development, etching, and photoresist peeling off.

The manufacturing method of a light emitting device may be used to manufacture the light emitting device provided by the above second embodiment.

In the light emitting device manufactured by the manufacturing method of a light emitting device in the embodiment, by providing light extraction particles in the metal electrode, the light extraction particles may destroy the surface plasma waves generated by the metal electrode, so that light fallen into the surface plasma waves may be extracted, thus the light extraction efficiency of the metal electrode can be increased, and the light extraction efficiency of the light emitting device can be increased. In the light emitting device in the embodiment, the transparent electrode is provided between the metal electrode and the organic layer to ensure injection and transfer characteristics of carriers between the metal electrode and the organic layer. In the embodiment, the metal electrode and the organic layer constitute a composite electrode, on the premise of injection and transfer characteristics of carriers of the light emitting device of its own being ensured, the composite electrode may increase the light extraction efficiency of the light emitting device.

It should be understood that, the above embodiments are described only to illustrate the principle of the invention, and the invention is not limited thereto. Persons skilled in the art can make various modifications and improvements without departing from the principle and substance of the invention, and these modifications and improvements should be considered to be within the protection scope of the invention.

The invention claimed is:

1. A light emitting device comprising: a base substrate and a laminated structure formed on the base substrate, the laminated structure including a first electrode, an organic layer and a second electrode which are laminated, the organic layer is provided between the first electrode and the second electrode, wherein the first electrode is a transparent electrode, the second electrode is provided with light extraction particles therein, the second electrode is a metal electrode, and the second electrode has rough surfaces.

2. The light emitting device of claim 1, wherein the first electrode is provided on the base substrate, and the laminated structure further comprises a transparent electrode provided between the organic layer and the second electrode.

3. The light emitting device of claim 1, wherein the second electrode is provided on the base substrate, and the laminated structure further comprises a transparent electrode provided between the base substrate and the second electrode.

4. The light emitting device of claim 1, wherein the metal electrode has a reflectivity of more than 95%.

5. The light emitting device of claim 1, wherein the metal electrode has a thickness of 50 nm to 300 nm.

6. The light emitting device of claim 2, wherein the transparent electrode has a thickness of 10 nm to 100 nm.

7. The light emitting device of claim 3, wherein the transparent electrode has a thickness of 10 nm to 100 nm.

8. The light emitting device of claim 1, wherein the light extraction particles are made of one or more of metal oxide, polymer, silicon oxide, zinc sulfide and zinc selenide.

9. The light emitting device of claim 1, wherein the size of the light extraction particle is 10 nm to 1000 nm.

10. The light emitting device of claim 2, wherein the transparent electrode is made of one or more of ITO, IZO, ITZO, AZO, FTO and GITO.

11. The light emitting device of claim 3, wherein the transparent electrode is made of one or more of ITO, IZO, ITZO, AZO, FTO and GITO.

12. The light emitting device of claim 10, wherein in a case that the transparent electrode is made of more than one of ITO, IZO, ITZO, AZO, FTO and GITO, the transparent electrode is a multilayered structure.

13. The light emitting device of claim 11, wherein in a case that the transparent electrode is made of more than one of ITO, IZO, ITZO, AZO, FTO and GITO, the transparent electrode is a multilayered structure.

14. A display device comprising the light emitting device of claim 1.

15. A manufacturing method of a light emitting device, comprising steps of:

laminatedly forming a first electrode, an organic layer and a second electrode on a base substrate so that the organic layer is formed between the first electrode and the second electrode, and the second electrode is provided with light extraction particles therein,
wherein the second electrode is a metal electrode, and the second electrode has rough surfaces, and
wherein the first electrode is a transparent electrode.

16. The manufacturing method of a light emitting device of claim 15, wherein the step of laminatedly forming a first electrode, an organic layer and a second electrode on a base substrate comprises:
   forming the first electrode on the base substrate;
   forming the organic layer on the first electrode;
   forming the second electrode on the organic layer, and
   wherein the manufacturing method further comprises, after forming the organic layer and before forming the second electrode, a step of:
   forming a transparent electrode on the organic layer.

17. The manufacturing method of a light emitting device of claim 15, wherein the step of laminatedly forming a first electrode, an organic layer and a second electrode on a base substrate comprises:
   forming the second electrode on the base substrate;
   forming the organic layer on the second electrode;
   forming the first electrode on the organic layer, and
   wherein the manufacturing method further comprises, before forming the second electrode, a step of:
   forming a transparent electrode on the base substrate.

* * * * *